(12) United States Patent
Mernyei et al.

(10) Patent No.: US 6,690,244 B2
(45) Date of Patent: Feb. 10, 2004

(54) LOW PHASE-NOISE INTEGRATED VOLTAGE CONTROLLED OSCILLATOR

(75) Inventors: Ferenc Mernyei, Budapest (HU); Janos Erdelyi, Dunakeszi (HU)

(73) Assignee: Integration Associates, Inc., Mountain View, CA (US)

( * ) Notice: Subject to any disclaimer, the term of this patent is extended or adjusted under 35 U.S.C. 154(b) by 0 days.

(21) Appl. No.: 09/996,144

(22) Filed: Nov. 28, 2001

(65) Prior Publication Data

US 2002/0130726 A1 Sep. 19, 2002

(30) Foreign Application Priority Data

Feb. 23, 2001 (HU) .............................................. 0100884

(51) Int. Cl.[7] .................................................. H03B 5/00
(52) U.S. Cl. .............................. 331/117 R; 331/108 C; 331/117 FE; 331/177 V; 331/167
(58) Field of Search ........................ 331/108 C, 117 R, 331/117 FE, 177 V, 167, 117 D

(56) References Cited

U.S. PATENT DOCUMENTS 5,371,475 A * 12/1994 Brown ........................ 330/254
6,081,167 A   6/2000 Kromat

* cited by examiner

*Primary Examiner*—Arnold Kinkead
(74) *Attorney, Agent, or Firm*—Vernon W. Francissen; Gardner Carton & Douglas LLP

(57) ABSTRACT

A variable frequency oscillator circuit comprising a resonator circuit part and an amplifier circuit part. The resonator circuit part has a first end and a second end, and it comprises a parallel connected inductor-capacitance pair. The amplifier circuit part comprises first and second transistors having a collector, base, and emitter. The amplifier circuit part further comprises a first impedance matching element connected between the base of the second transistor and the first end of the resonator circuit part, and a second impedance matching element connected between the base of the first transistor and the second end of the resonator circuit part. The impedance matching elements are inductors, namely the third inductor and the fourth inductor. The application of the inductors provides a noise-matched optimum source impedance for the active amplifier circuit part.

22 Claims, 4 Drawing Sheets

LOW PHASE-NOISE INTEGRATED VOLTAGE CONTROLLED OSCILLATOR

BACKGROUND OF THE INVENTION

The present invention relates to a low phase-noise voltage controlled oscillator (VCO), primarily to be realised as a VCO integrated on a single chip.

Voltage controlled oscillators are found in a number of applications. With the advance of mobile communications, there is a growing need for VCO-s, which must meet strict technical specifications. Simultaneously, there is also a constant demand for a high level of integration of the electronic components.

Communications equipment operating in the GHz range requires VCOs working in these frequencies. On lower frequencies, it is normally not possible to integrate VCO-s fully onto a single chip, because the quality factor (Q) of the inductors does not reach the necessary values. However, it is possible to manufacture integrated inductors for the GHz frequency range. It has been shown that the design of inductors operating between 1–5 GHz is feasible with existing integrated circuit technologies.

One of the critical parameters of VCOs used in communications equipment is the phase noise. Low phase noise is desirable to avoid the interference between neighbouring transmission channels, which operate on frequencies close to each other. Typically, for a VCO operating in the lower GHz range, it is required that the phase noise is below –100 dB/Hz at a 100 kHz offset from the carrier frequency.

It is known that the quality factor of a VCO may be improved with differential circuits. Particularly, the use of a cross-coupled transistor pair together with a passive resonator has been suggested by several authors. The passive resonator mostly consists of an inductor-capacitance pair, the ends of which are connected to the collectors of the cross-coupled transistors. Efforts were mostly directed towards improving the quality factor of the inductor in the resonator.

U.S. Pat. No. 6,081,167 to Kromat discloses a differential VCO with an inductor-capacitance pair, and a pair of cross-coupled transistors, acting as amplifiers. There is a capacitance between the ends of the resonator and the bases of the transistors. In order to reduce the phase noise, it is suggested to use CMOS transistors as current switches, while using bipolar transistors as current source transistors. However, this solution does not concern or suggest any impedance matching between the resonator and the amplifier part, in order to reduce the resultant phase noise.

SUMMARY OF THE INVENTION

In an exemplary embodiment of a first aspect of the invention, there is disclosed a variable frequency oscillator circuit comprising a resonator circuit part and an amplifier circuit part. The resonator circuit part has a first end and a second end, and it comprises a parallel connected inductor-capacitance pair. The amplifier circuit part comprises first and second transistors having a collector, base, and emitter. The collector of the first transistor is connected to the first end of the resonator circuit part, while the collector of the second transistor is connected to the second end of the resonator circuit part. The base of the first transistor is cross-connected to the second end of the resonator circuit part and to the collector of the second transistor. The base of the second transistor is cross-connected to the first end of the resonator circuit part and to the collector of the first transistor. The amplifier circuit part further comprises a first impedance matching element connected between the base of the second transistor and the first end of the resonator circuit part, and a second impedance matching element connected between the base of the first transistor and the second end of the resonator circuit part.

Preferably, the impedance matching element is an inductor. In particularly advantageous embodiment, the amplifier circuit part and the resonator circuit part are integrated on a common single chip.

In another aspect of the invention, there is proposed a method for improving the phase-noise performance of a variable frequency oscillator circuit, where the VCO comprises a passive resonator circuit part and an active amplifier circuit part operatively connected to the passive resonator circuit part. The method comprises the step of providing a noise-matched optimum source impedance for the active amplifier circuit part.

BRIEF DESCRIPTION OF THE DRAWINGS

The invention is explained with reference to the accompanying drawings, where.

DETAILED DESCRIPTION OF THE PRESENT INVENTION

Figure 1:
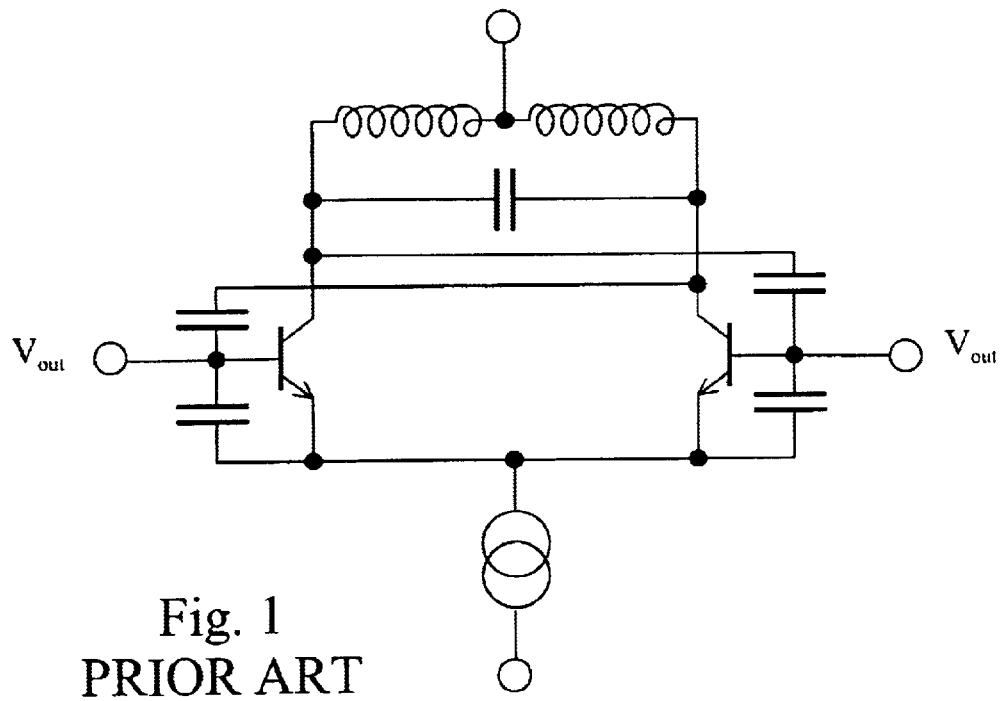
FIG. 1 shows a known VCO circuit.
Figure 2:
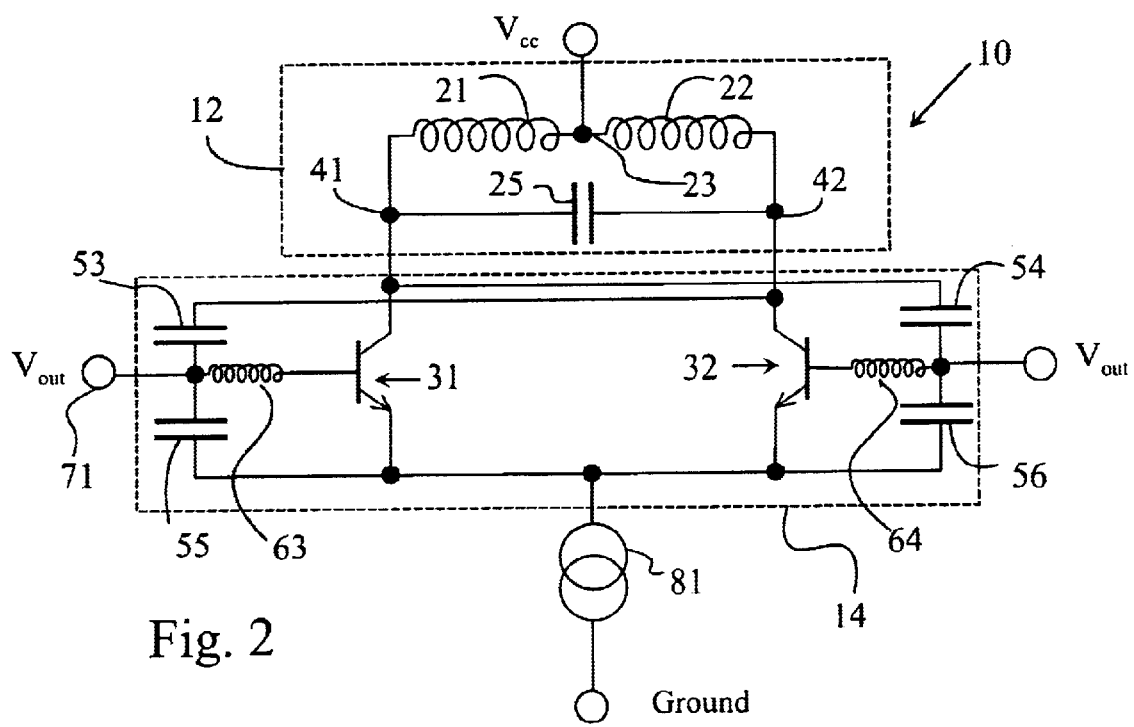
FIG. 2 is a schematic diagram of a VCO circuit with a noise matching impedance element between the amplifier and the resonator.

Referring now to FIG. 2, there is shown a variable frequency oscillator circuit 10, hereafter referred to shortly as "VCO". The VCO 10 comprises a resonator circuit part 12 and an amplifier circuit part 14. The resonator circuit part 12 has a first end and a second end. The resonator circuit part 12 comprises a parallel connected inductor-capacitance pair. In the shown embodiment, the inductor of the inductor-capacitance pair comprises a first inductor 21 and second inductor 22 connected at a first end 23, and the first end 23 of the first and second inductors 21,22 is connected to a supply voltage 24 of the VCO 10. The capacitance 25 of the inductor-capacitance pair is connected in parallel to the first and second inductors 21,22.

The amplifier circuit part of the VCO 10 comprises a first transistor 31 and a second transistor 32. The transistors 31,32 have a collector, base, and emitter. The collector of the first transistor 31 is connected to the first end of the resonator circuit part at a node 41, while the collector of the second transistor 32 is connected to the second end of the resonator circuit part, at a node 42.

The base of the first transistor 31 is cross-connected to the second end of the resonator circuit part, essentially and to the collector of the second transistor 32 via the third capacitance 53. At the same time, the base of the second transistor 32 is cross-connected to the first end of the resonator circuit part and to the collector of the first transistor 31 via the fourth capacitance 54. With other words, a third capacitance 53 is connected between the base of the first transistor 31 and the collector of the second transistor 32, and a fourth capacitance 54 is connected between the base of the second transistor 32 and the collector of the first transistor 31.

In order to reduce the phase noise of the VCO 10, the amplifier circuit part 14 further comprises a first impedance matching element connected between the base of the second transistor 32 and the first end of the resonator circuit part (node 41), and a second impedance matching element connected between the base of the first transistor 31 and the second end of the resonator circuit part (node 42). In the embodiment shown in FIGS. 2–6, the impedance matching elements are inductors, namely the third inductor 63 and the fourth inductor 64. The application of the inductors 63 and 64 provides a noise-matched optimum source impedance for the active amplifier circuit part.

The inductors serving as the noise-matching impedance element may be tuned for minimising the phase noise of the active amplifier circuit part. In this manner, the noise contribution of the amplifier to the total noise of the VCO will be reduced, and the total phase noise of the complete VCO circuit will decrease. This effect may be significant, even if the quality factor of the inductors in the tank LC circuit is not particularly good. As much as 3–5 dB noise reduction may be achieved in this manner.

While in a typical application the noise-matching impedance elements would be optimised for minimising the phase noise of the active amplifier circuit part, it is also foreseen to provide a noise-matching impedance element, which is tuned for maximising or at least increasing the gain of the active amplifier circuit part, while also contributing to the noise reduction in the amplifier and thereby in the complete VCO.

The base of the first and second transistors 31,32 is operatively connected to first and second output terminals 71,72, respectively. The emitters of the first and second transistors 31,32 are connected to the ground via the current generator 81. The performance of the VCO 10 is improved if a fifth and sixth capacitance 55,56 is connected between the base and the emitter of the first transistor 31 and the base and the emitter of the second transistor 32, respectively, as shown in FIG. 2.

Figure 3:
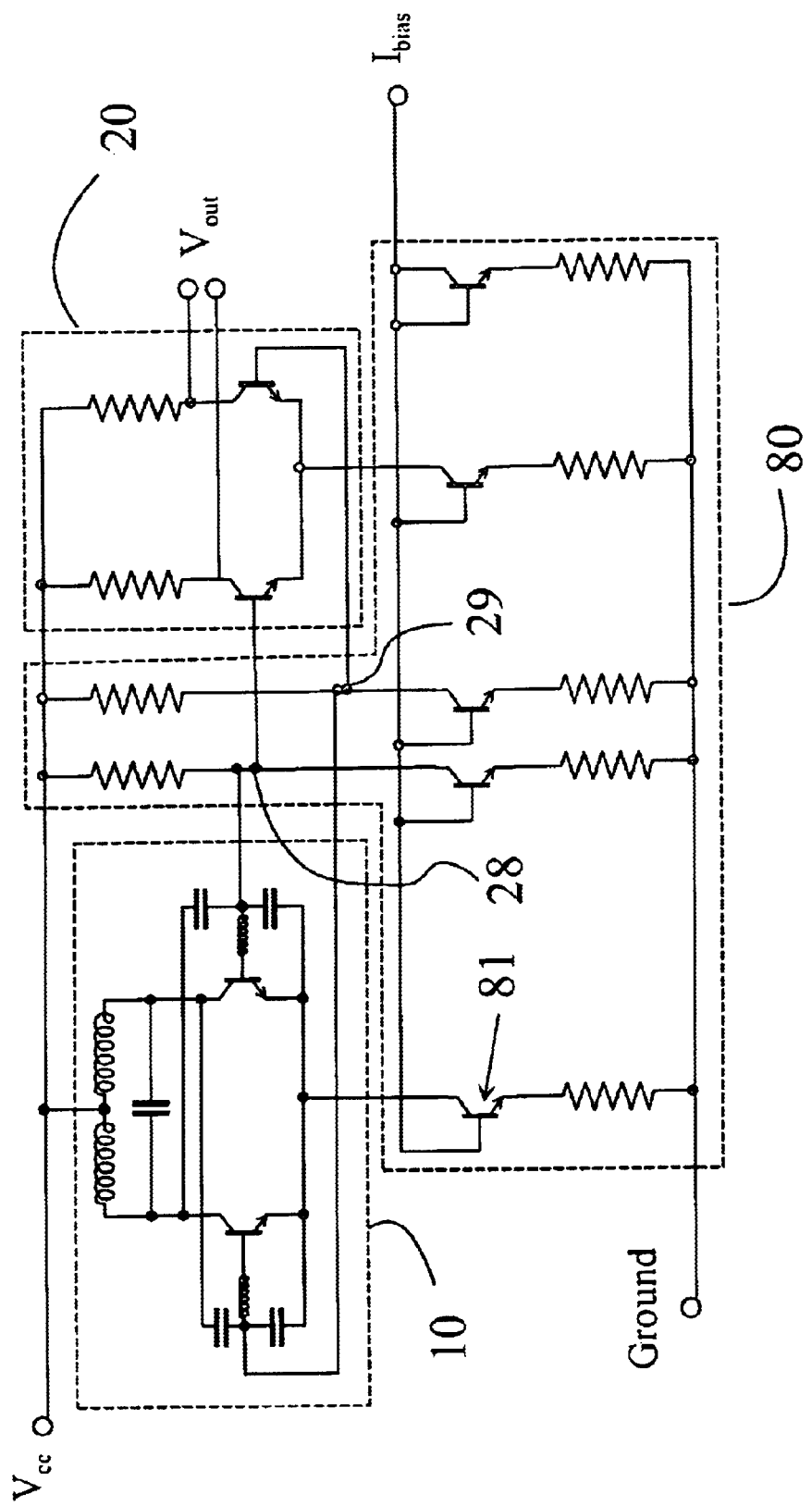
FIG. 3 is a more specific application example of a VCO circuit.
Figure 6:
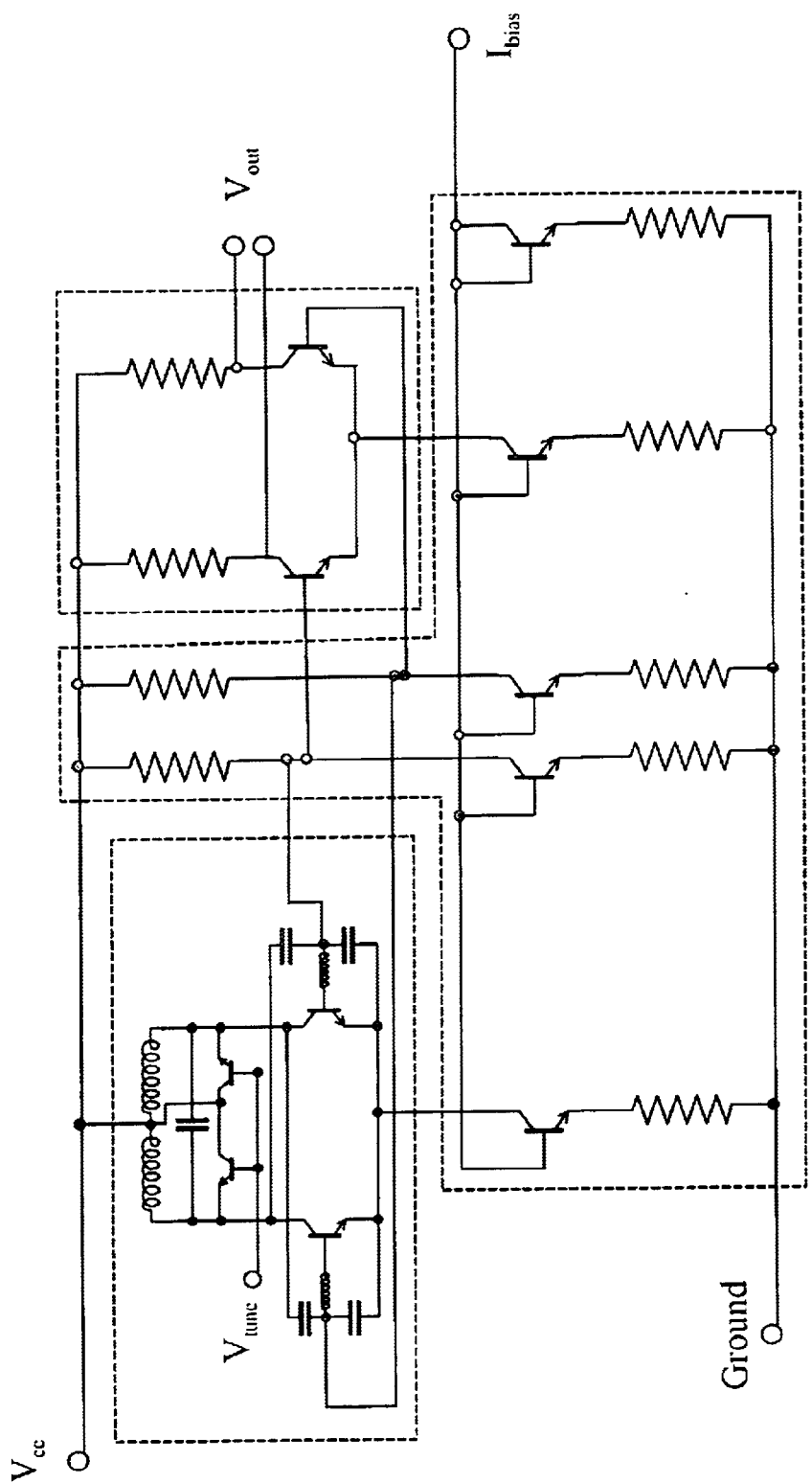
FIG. 6 is an application example of the circuit of FIG. 4, similar to the circuit of FIG. 3.

In the embodiment shown in FIGS. 3 and 6, the VCO 10 is also supplemented with a biasing circuit part 80, which includes the current generator 81. The emitters of the first and second transistors 31,32 are connected to the current generator 81. The current generator 81 is realised by the transistor 82. The biasing circuit part 80 also includes bias current generators for the output buffer circuit part 20 (see below).

The embodiments of the VCO circuits shown in FIG. 3 also comprise an output buffer circuit part 20, beside the core VCO 10. The base of the first and second transistors 31,32 is connected to the inputs of the output buffer circuit part 20, i. e. to the nodes 28,29.

Figure 4:
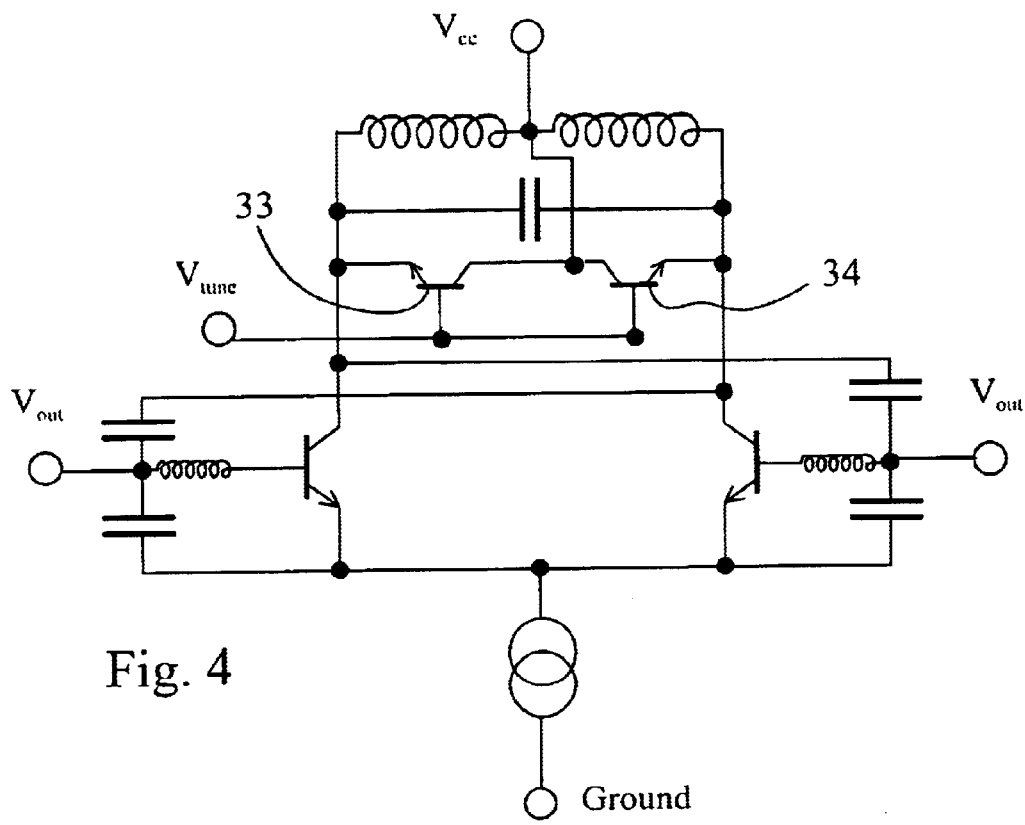
FIG. 4 is a schematic diagram of a VCO circuit similar to FIG. 2, with additional elements.
Figure 5:
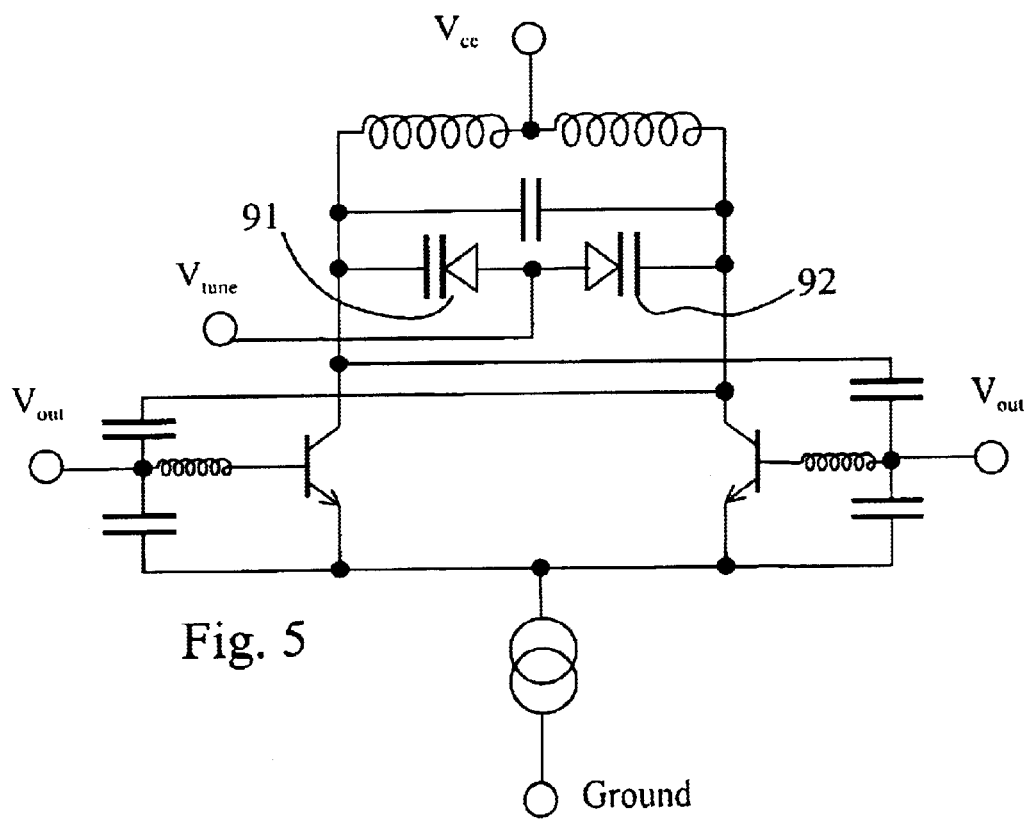
FIG. 5 is a modified version of the circuit shown in FIG. 4.

In order to be able to control the operating frequency of the VCO 10, a tuning voltage source is operatively connected to the first and second end of the resonator circuit part. FIGS. 4 and 5 demonstrate two possible solutions for providing voltage control of the resonance frequency of the VCO 10. These solutions of the frequency tuning are known in the art per se.

In the embodiment of FIG. 4, a third transistor 33 and a fourth transistor 34 is connected between the tuning voltage source $V_{tune}$ and the first and second ends of the resonator circuit part, here represented by the nodes 41 and 42. More precisely, the base of the third and fourth transistors 33,34 are connected to the tuning voltage source $V_{tune}$, while the emitters of the third and fourth transistors 33,34 are connected to the first and second ends of the resonator circuit part. The collectors of the third and fourth transistors 33,34 are connected to the supply voltage source $V_{cc}$.

In the embodiment of FIG. 5, the frequency tuning is effected with two varactors 91,92, which are connected to the tuning voltage source $V_{tune}$. Otherwise, the elements of the VCO are the same as shown in FIGS. 2 and 4.

FIG. 6 shows a complete VCO circuit with a biasing circuit 80 and an output buffer 20, similar to the VCO in FIG. 3, with the only difference that the core VCO circuit is realised as the circuit in FIG. 4.

The suggested VCO circuit is particularly useful where the transistors 31,32 of the amplifier part are Bi-CMOS transistors, because the bipolar elements are often the main noise source of Bi-CMOS transistors. Their noise contribution may be significantly reduced with the addition of the noise matching impedance element, e. g. the inductors 63,64. Inductors are mostly suggested because the transistors 31,32 themselves tend to be capacitive, therefore the combined complex impedance of the transistors 31,32 is best controlled with an inductor.

In most cases, the amplifier circuit part and the resonator circuit part of the VCO 10 are integrated on a common single chip. However, it is also feasible to integrate only the amplifier circuit part or only the resonator circuit part on a single chip. Typically, the inductors of the resonator are often made as separate elements with hybrid technology, mainly to be able to use inductors with a high quality factor.

What is claimed is:

1. A variable frequency oscillator circuit comprising a resonator circuit part and an amplifier circuit part, the resonator circuit part having a first and a second end, the resonator circuit part comprising:
   a: a parallel connected inductor-capacitance pair, the amplifier circuit part comprising;
   b: first and second transistors having a collector, base, and emitter, where
   c: the collector of the first transistor is connected to the first end of the resonator circuit part, while the collector of the second transistor is connected to the second end of the resonator circuit part,
   d: the base of the first transistor is cross-connected to the second end of the resonator circuit part and to the collector of the second transistor, and the base of the second transistor is cross-connected to the first end of the resonator circuit part and to the collector of the first transistor, the amplifier circuit part further comprising;
   e: a first impedance matching element connected between the base of the second transistor and the first end of the resonator circuit part, and a second impedance matching element connected between the base of the first transistor and the second end of the resonator circuit part.

2. The variable frequency oscillator circuit of claim 1, wherein at least one of impedance matching elements is an inductor.

3. The variable frequency oscillator circuit of claim 1, wherein the inductor of the inductor-capacitance pair comprises a first and second inductor connected at a first end, and the first end of the first and second inductors is connected to a supply voltage of the VCO.

4. The variable frequency oscillator circuit of claim 1, wherein the base of the first and second transistors is operatively connected to a first and second output terminal, respectively.

5. The variable frequency oscillator circuit of claim 1, wherein a second and a third capacitance is connected between
   the base of the first transistor and the collector of the second transistor; and
   the base of the second transistor and the collector of the first transistor, respectively.

6. The variable frequency oscillator circuit of claim 1, wherein a fourth and fifth capacitance is connected between
   the base and the emitter of the first transistor; and
   the base and the emitter of the second transistor, respectively.

7. The variable frequency oscillator circuit of claim 1, further comprising a biasing circuit part with a current generator, wherein the emitter of the first and second transistors is connected to the current generator.

8. The variable frequency oscillator circuit of claim 1, further comprising an output buffer circuit part, wherein the base of the first and second transistors is connected to the inputs of the output buffer circuit part.

9. The variable frequency oscillator circuit of claim 1, wherein a tuning voltage source is operatively connected to the first and second end of the resonator circuit part.

10. The variable frequency oscillator circuit of claim 1, wherein the transistors are Bi-CMOS transistors.

11. The variable frequency oscillator circuit of claim 1, wherein the amplifier circuit part is integrated on a single chip.

12. The variable frequency oscillator circuit of claim 1, wherein the resonator circuit part is integrated on a single chip.

13. The variable frequency oscillator circuit of claim 1, wherein the amplifier circuit part and the resonator circuit part are integrated on a common single chip.

14. A method for improving the phase-noise performance of a variable frequency oscillator circuit (VCO), the VCO comprising a passive resonator circuit part and an active amplifier circuit part operatively connected to the passive resonator circuit part, the method comprising the step of providing an inductive noise-matched optimum source impedance element for the active amplifier circuit part.

15. The method of claim 14, further comprising the step of providing the inductive noise-matching optimum source impedance element between the output terminals of the passive resonator circuit part and the input terminals of the active amplifier circuit part.

16. The method of claim 14, further comprising the step of providing the inductive noise-matching optimum source impedance element tuned for minimizing noise of the active amplifier circuit part.

17. The method of claim 14, further comprising the step of providing the inductive noise-matching optimum source impedance element tuned for maximizing gain of the active amplifier circuit part.

18. The method of claim 14, further comprising the step of providing an inductor on the input terminals of the active amplifier circuit part.

19. The method of claim 14, further comprising the step of integrating the active amplifier circuit part on a single chip.

20. The method of claim 14, further comprising the step of integrating the passive resonator circuit part on a single chip.

21. The method of claim 14, further comprising the step of integrating the active amplifier circuit part and the passive resonator circuit part on a common single chip.

22. The variable frequency oscillator circuit of claim 9, wherein third and fourth transistors are connected between the tuning voltage source and the first and second ends of the resonator circuit part, and the base of the third and fourth transistors are connected to the tuning voltage source.

* * * * *